United States Patent
Bailey

(10) Patent No.: US 7,626,531 B2
(45) Date of Patent: Dec. 1, 2009

(54) SYSTEMS AND METHODS FOR ANALOG TO DIGITAL CONVERSION

(75) Inventor: James A. Bailey, Snowflake, AZ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/024,909

(22) Filed: Feb. 1, 2008

(65) Prior Publication Data

US 2009/0195432 A1    Aug. 6, 2009

(51) Int. Cl.
  *H03M 1/12*    (2006.01)
(52) U.S. Cl. ...................................... 341/156
(58) Field of Classification Search ............ 341/155, 341/156, 160, 164, 169
  See application file for complete search history.

(56) References Cited

U.S. PATENT DOCUMENTS

| | | | |
|---|---|---|---|
| 4,918,450 A | 4/1990 | Sugiyama | |
| 5,173,698 A | 12/1992 | Gulczynski | |
| 5,225,837 A | 7/1993 | Hosatani et al. | |
| 5,809,060 A | 9/1998 | Cafarella et al. | |
| 5,874,911 A * | 2/1999 | Kodama | 341/156 |
| 6,181,269 B1 * | 1/2001 | Nishiuchi et al. | 341/164 |
| 6,232,908 B1 * | 5/2001 | Nakaigawa | 341/160 |
| 6,369,743 B2 | 4/2002 | Ono | |
| 6,404,374 B1 | 6/2002 | Yu | |
| 6,653,966 B1 | 11/2003 | van der Goes et al. | |
| 7,190,298 B2 | 3/2007 | Mulder | |
| 7,209,068 B1 | 4/2007 | Chen et al. | |
| 7,233,277 B2 * | 6/2007 | Roh | 341/169 |
| 7,482,844 B2 | 1/2009 | Brady | |
| 2007/0183006 A1 | 8/2007 | Lee | |

OTHER PUBLICATIONS

Brandt et al., "A 75-mW, 10-b, 10 MSPS CMOS Subranging ADC with 9.5 Effective Bits at Nyquist", IEEE J. Solid State Circuits, vol. 34, No. 12, pp. 1788-1795, Dec. 1999.
Daito et al., "A 14-bit 20-MS/s Pipelined ADC With Digital Distortion Calibration," IEEE J. Solid-State Circuits, vol. 41, No. 11, pp. 2417-2423, Nov. 2006.
Gupta et al., "A 1GS/s 11b Time Interleaved ADC in 0.13um CMOS", ISSCC Dig. Tech. Papers, pp. 576-577, Feb. 2006.
Kim et al., "A 10-b, 10MS/s CMOS A/D Converter", IEEE J. Solid State Circuits, vol. 32, No. 3, pp. 302-311, Mar. 1997.

(Continued)

*Primary Examiner*—Jean B Jeanglaude
(74) *Attorney, Agent, or Firm*—Hamilton, DeSanctis & Cha

(57) ABSTRACT

Various different approaches are provided for conversion of analog signals to digital signals. For example, various partially clocked, multi-step analog to digital converters are discussed. Such analog to digital converters include a clocked fine conversion stage, a clocked coarse conversion stage, and a clock circuit. The fine conversion stage includes a first group of comparators clocked by a first clock and a second group of comparators clocked by a second clock. The first group of comparators is operable to compare an input voltage with a first fine reference voltage range, and the second group of comparators is operable to compare the input voltage with a second fine reference voltage range. The coarse conversion stage includes a group of clocked comparators that are operable to compare the input voltage with a coarse reference voltage range. The clock circuit selectably asserts one of the first clock and the second clock based at least in part on an output of the second conversion stage.

25 Claims, 6 Drawing Sheets

OTHER PUBLICATIONS

Mehr et al., "A 55-mW, 10-bit, 40-Msample/s Nyquist-Rate CMOS ADC," IEEE J. Solid-State Circuits, vol. 35, No. 3, pp. 302-311, Mar. 2000.

Nagaraj et al., "A 250 mW 8-b, 52 Msamples/s Parallel-pipelined A/D Converter with Reduced Number of Amplifiers", IEEE J. Solid State Circuits, vol. 32, pp. 312-320, Mar. 1997.

Singer et al., "A 14-bit 10-MHz calibration-free CMOS pipelined A/D converter," in symp. VLSI Circuits Dig. Tech. Papers, Jun. 1996, pp. 38-39.

U.S. Appl. No. 12/024,893, filed Feb. 1, 2008, Bailey et al.

* cited by examiner

SYSTEMS AND METHODS FOR ANALOG TO DIGITAL CONVERSION

BACKGROUND OF THE INVENTION

The present invention is related to electronic signal conversion, and more particularly to analog to digital converters.

Turning to FIG. 1, a prior art flash analog to digital converter circuit 100 is shown that includes a resistor ladder 130 that generates a number of reference voltage levels for comparison with an input conversion voltage 190 by respective ones of comparators 110. A negative input of each of the comparators is fed by the output of a respective multiplexer 120. Each of the multiplexers 120 selects between six different reference voltages generated by the resistor ladder. While three comparators 110, three multiplexers 120 and a resistor ladder including ten resistors are shown, more than these numbers may be included in the circuit as indicated by marks 195, 196.

As shown, resistor ladder 130 includes a number of resistors 160, 161, 162, 163, 164, 165, 166, 167, 168, 169 that are connected in series between a lower voltage potential 150 and an upper voltage potential 140. Each of the aforementioned resistors generates a distinct reference voltage level that may be chosen for comparison by one of comparators 110. In particular, multiplexer 120a receives upper voltage potential 140, a voltage 170 that is one IR drop below upper voltage reference 140, a voltage 171 that is two IR drops below upper voltage reference 140, a voltage 172 that is three IR drops below upper voltage reference 140, a voltage 173 that is four IR drops below upper voltage reference 140, and a voltage 174 that is five IR drops below upper voltage reference 140. Multiplexer 120a is operable to select one of the aforementioned reference voltage levels to pass to comparator 110a for comparison with an input conversion voltage 190.

Multiplexer 120b receives voltage 172, voltage 173, voltage 174, a voltage 175 that is six IR drops below upper voltage reference 140, a voltage 176 that is seven IR drops below upper voltage reference 140, and a voltage 177 that is eight IR drops below upper voltage reference 140. Multiplexer 120b is operable to select one of the aforementioned reference voltage levels to pass to comparator 110b for comparison with input conversion voltage 190. Multiplexer 120c receives a number of reference voltage levels including lower voltage potential 150, a voltage 179 that is one IR drop above lower voltage potential 150, and a voltage 178 that is two IR drops above lower voltage potential 150. Multiplexer 120c is operable to select one of the aforementioned reference voltage levels to pass to comparator 110c for comparison with input conversion voltage 190.

The above described analog to digital converter provides an effective analog to digital conversion, however, such an approach is relatively expensive in terms of both area and power. A general trend in flash analog to digital converter circuits is to reduce power and area costs through reducing the number of comparators that are utilized in such circuits. An example of such an approach is discussed in Brandt et al., "A 75 mW, 10-b, 20-MSPS CMOS Subranging ADC with 9.5 Effective Bits at Nyquist", IEEE Journal of Solid-State Circuits, Vol. 34, No. 12, December 1999. The entirety of the aforementioned article is incorporated herein by reference for all purposes. The article discusses the use of a coarse comparator bank and a fine comparator bank. In operation, the coarse comparator bank identifies in which of four coarse reference segments an analog input lies. Based on this determination, a number of switches are selected to drive a desired reference voltage level range to the comparators in the fine comparator bank. By doing such, the fine comparator bank includes only a limited number of comparators along with a switching network that allows for effective use of the limited number of comparators. In particular, the use of such an architecture reduces the number of comparators to a proportion of $2^{N/2}$, where N is the resolution of the analog to digital converter. Thus, for example, only sixty-two comparators are nominally required for a ten bit ADC.

Turning to FIG. 2, an exemplary prior art, four bit subranging analog to digital converter circuit 200 is shown. Analog to digital converter 200 includes a coarse comparator bank 210 consisting of three comparators 212 and a fine comparator bank 230 consisting of three comparators 232. Each of fine comparator bank 230 and coarse comparator bank 210 receive reference values from a resistor ladder 250. Resistor ladder 250 includes resistors 251-266 connected between an upper voltage reference (Vref+) and a negative voltage reference (Vref−). In particular, comparator 212a compares an input voltage 290 with the reference taken between resistor 254 and resistor 255, comparator 212b compares input voltage 290 with the reference taken between resistor 258 and resistor 259, and comparator 212c compares input voltage 290 with the reference taken between resistor 262 and resistor 263. Comparator 232a compares input voltage 290 with one of four references taken between resistor 251 and resistor 252, between resistor 255 and resistor 256, between resistor 259 and resistor 260, and between resistor 263 and resistor 264 as controlled by switches 271, 274, 277, 280; comparator 232b compares input voltage 290 with one of four references taken between resistor 252 and resistor 253, between resistor 256 and resistor 257, between resistor 260 and resistor 261, and between resistor 264 and resistor 265 as controlled by switches 272, 275, 278, 281; and comparator 232c compares input voltage 290 with one of four references taken between resistor 253 and resistor 254, between resistor 257 and resistor 258, between resistor 261 and resistor 262, and between resistor 265 and resistor 266 as controlled by switches 273, 276, 279, 282.

In operation, coarse comparator bank 210 provides a determination of the range in which a fine comparison should be taken. This output is used to select switches 271-282 such that the appropriate reference range is applied to fine comparator bank 230. Then, the output of fine comparator bank 230 and the output of coarse comparator bank 210 are combined to provide the circuit output. In operation, the output of coarse comparator bank 210 must settle before fine comparator bank 230 may be operated. This significantly limits the operating frequency of analog to digital converter 200. While such an approach may work reasonably well for a limited number of bits (i.e., for a limited conversion resolution), for a large number of bits a substantial cost in terms of area is expended on switches corresponding to switches 271-282. Further, where the analog to digital converter circuit is expected to operate quickly, the power consumed by the aforementioned switches can be very significant.

Hence, for at least the aforementioned reasons, there exists a need in the art for advanced systems, circuits and methods for electronic signal conversion.

BRIEF SUMMARY OF THE INVENTION

The present invention is related to electronic signal conversion, and more particularly to analog to digital converters.

Various embodiments of the present invention provide partially clocked, multi-step analog to digital converters. Such analog to digital converters include a clocked fine conversion stage, a clocked coarse conversion stage, and a clock circuit.

The fine conversion stage includes a first group of comparators clocked by a first clock and a second group of comparators clocked by a second clock. The first group of comparators is operable to compare an input voltage with a first fine reference voltage range, and the second group of comparators is operable to compare the input voltage with a second fine reference voltage range. In some cases, the comparators of the first group of comparators and the comparators of the second group of comparators are dynamic comparators. The coarse conversion stage includes a group of clocked comparators that are operable to compare the input voltage with a coarse reference voltage range. The clock circuit selectably asserts one of the first clock and the second clock based at least in part on an output of the first conversion stage. In various instances of the aforementioned embodiments, the analog to digital converters further include a converted output that is a combination of the output of the fine conversion stage and the output of the coarse conversion stage. The output of the fine conversion stage may be one of a combination of outputs from the first group of comparators or a combination of outputs from the second group of comparators selected based on the output of the coarse conversion stage.

Other embodiments of the present invention provide methods for converting an analog signal to a digital signal. The methods include providing an analog to digital converter with a fine conversion stage and a coarse conversion stage. The fine conversion stage includes a first comparator bank clocked by a first clock and a second comparator bank clocked by a second clock, and the coarse conversion stage provides a coarse output and the fine conversion stage provides a fine output. The methods further include applying an input voltage and a coarse reference voltage range to the coarse conversion stage, applying the input voltage and a first fine reference voltage range to the first comparator bank, and applying the input voltage and a second fine reference voltage range to the second comparator bank. Based on an output of the coarse conversion stage, the first clock or the second clock is selectably asserted and an output of the first comparator bank or an output of the second comparator bank is selected as the fine output. The fine output and the coarse output are combined.

In some instances of the aforementioned embodiments, the first comparator bank includes a first group of comparators each clocked by the first clock, and the second comparator bank includes a second group of comparators each clocked by the second clock. The output of the first comparator bank includes outputs of comparators of the first group of comparators, and the output of the second comparator bank includes outputs of comparators of the second group of comparators. In some cases, the comparators of the first group of comparators and the comparators of the second group of comparators are dynamic comparators.

In particular instances of the aforementioned embodiments, the fine conversion stage is a three bit analog to digital converter, and the coarse conversion stage is a 3.3 bit analog to digital converter. In such cases, the coarse conversion stage may include nine clocked comparators, and each of the first comparator bank and the second comparator bank includes at least seven clocked comparators.

Yet other embodiments of the present invention provide analog to digital converter circuits. Such circuits include a first conversion stage, a second conversion stage, and a clock circuit. The first conversion stage includes at least a first comparator that is operable to compare an input voltage and a first reference voltage upon assertion of a first clock and a second comparator that is operable to compare the input voltage and a second reference voltage upon assertion of a second clock. The second conversion stage includes at least a third comparator that receives the input voltage and a third reference voltage. The clock circuit selectably asserts one of the first clock and the second clock based at least in part on an output of the second conversion stage. In some cases, the first comparator and the second comparator are dynamic comparators.

In various instances of the aforementioned embodiments, the first comparator is associated with a first group of comparators and the second comparator is associated with a second group of comparators. In such instances, each comparator in the first group of comparators is clocked by the first clock, and each comparator in the second group of comparators is clocked by the second clock. Further, in such instances, an output of the first conversion stage is selected based on the output of the second conversion stage to include an output of each comparator in the first group of comparators or an output of each comparator in the second group of comparators.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to electronic signal conversion, and more particularly to analog to digital converters.

Various embodiments of the present invention provide partially clocked, multi-step analog to digital converters. Such analog to digital converters include a clocked fine conversion stage, a clocked coarse conversion stage, and a clock circuit A multi-bit output from the clocked coarse conversion stage is used to determine a sub-range of a voltage input. The fine conversion stage includes a number of comparators covering the overall input range of the analog to digital converter, however, only comparators for the identified sub-range are clocked during any given conversion. As only a subset of the comparators are clocked, substantial power savings can be achieved. Further, in some cases, the comparators may be relatively simple dynamic comparators that offer some savings in area. Thus, for example, in one case an analog to digital converter may be implemented to cover a broad input range using forty-one total comparators. Of the forty-one comparators, nine may be used to perform the coarse conversion, and the other thirty-two may be dynamic comparators used to perform the fine conversion. Of the thirty-two comparators used to perform the fine conversion, only seven or eight of them may be utilized for any given conversion. Based on the disclosure provided herein, one of ordinary skill in the art will recognize that more or fewer total comparators may be used, and that a variety of comparator distributions between the clocked fine conversion stage and the clocked coarse conversion stage may also be used. It should be noted that error correction may be performed by clocking one or more comparators above and below the selected sub-range.

Figure 1:
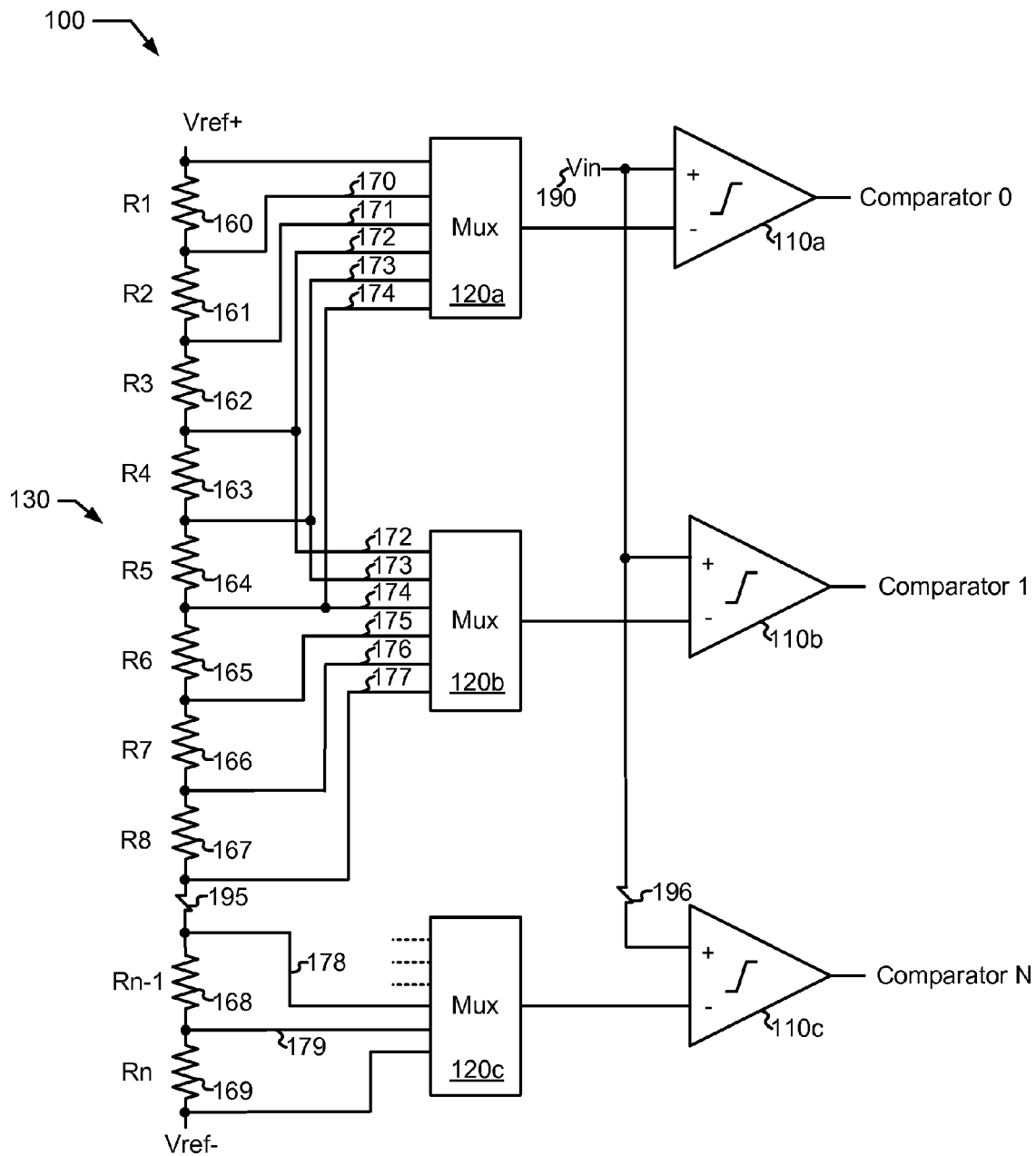
FIG. 1 is a prior art flash analog to digital converter including a resistor ladder and a multiplexer network.
Figure 2:
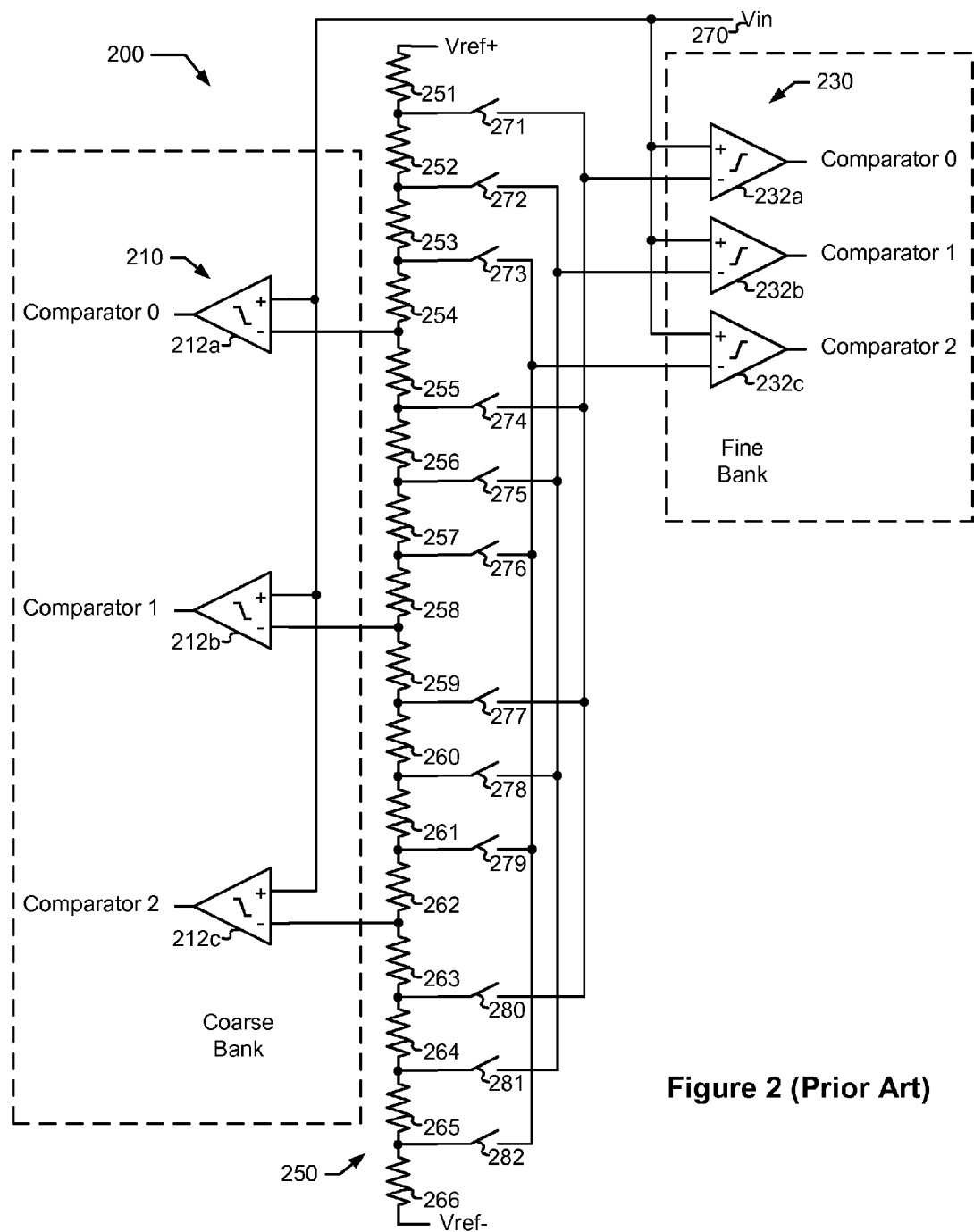
FIG. 2 is a prior art subranging flash analog to digital converter.
Figure 3:
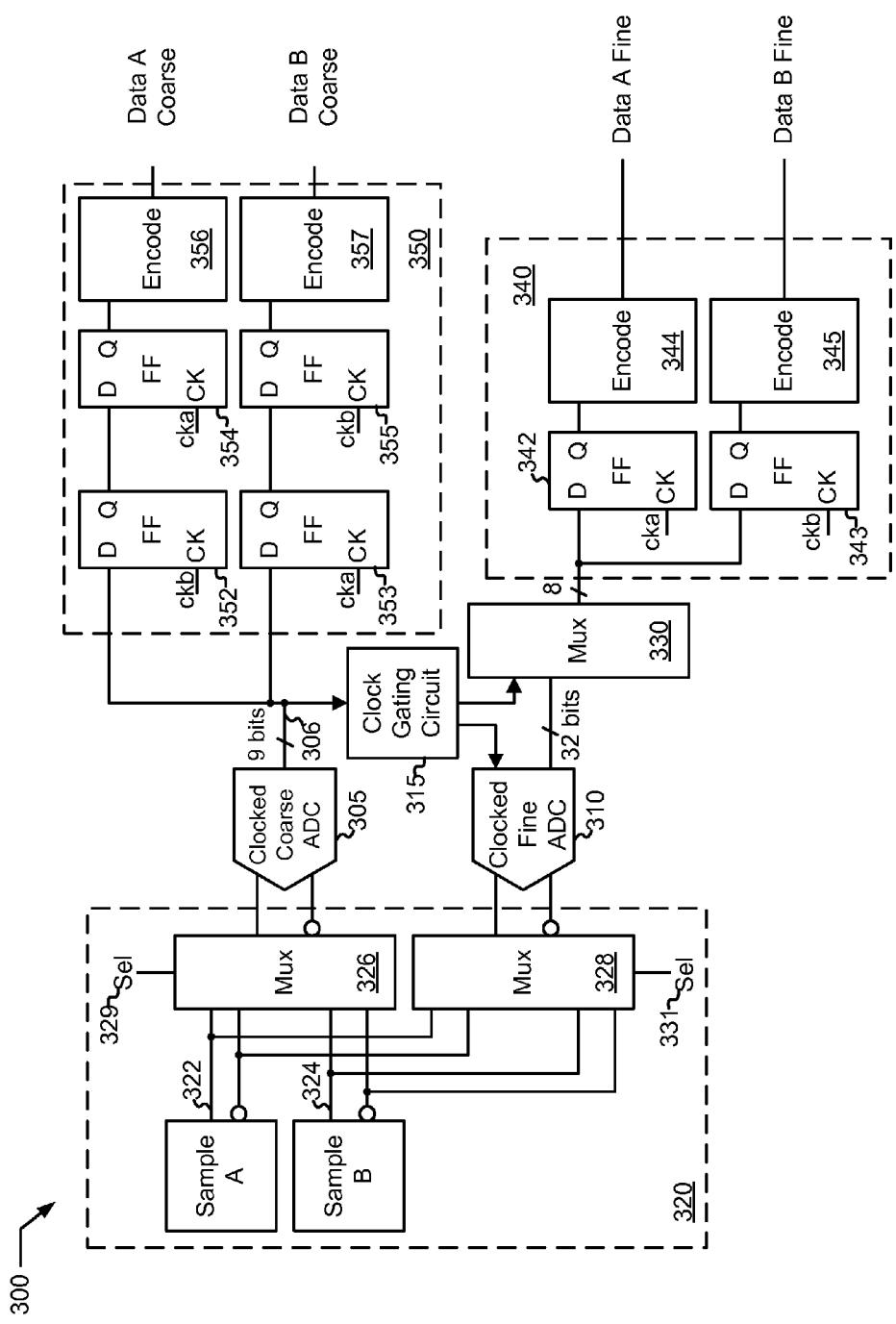
FIG. 3 depicts a partially clocked, two-step flash analog to digital converter circuit in accordance with some embodiments of the present invention.

Turning to FIG. 3, a partially clocked, two-step analog to digital converter circuit 300 is depicted in accordance with various embodiments of the present invention. Analog to digital converter 300 includes a clocked coarse analog to digital converter 305 and a clocked fine analog to digital converter 310. Clocked fine analog to digital converter 310 includes a number of comparator banks that are selectably clocked using different clocks. Each of the comparator banks is associated with a different voltage reference range. In one particular embodiment of the present invention, clocked coarse analog to digital converter 305 is a 3.3 bit analog to digital converter implemented using nine comparators, and clocked fine analog to digital converter 310 is a three bit analog to digital converter including thirty-two clocked, dynamic comparators implemented across multiple comparator banks. Analog to digital converter circuit 300 includes a clock gating circuit 315 that receives a coarse output 306 from clocked coarse analog to digital converter 305. Coarse output 306 allows for selecting which comparator banks in clocked fine analog to digital converter 310 are clocked, and which are not clocked for any given conversion.

In addition, analog to digital converter circuit 300 includes an input stage 320 that provides for interleaving two different samples through the analog to digital conversion process. In particular, input stage 320 includes a Sample A and a Sample B for conversion. A differential voltage 322 reflecting Sample A and a differential voltage 324 reflecting Sample B are provided to differential multiplexers 326, 328. In operation, input stage 320 introduces Sample A on one phase (i.e., cka) of a synchronizing clock, and Sample B on another phase (i.e., ckb) of the synchronizing clock using a select input.

Analog to digital converter circuit 300 also includes a multiplexer 330 capable of receiving outputs from the various comparator banks of clocked fine analog to digital converter 310, and for selecting which of the outputs are fed to a fine output stage 340. In the depicted embodiment, multiplexer 330 receives a thirty-two bit input and provides an eight bit output based on a control input from clock gating circuit 315. In particular, outputs from the set of comparators clocked by clock gating circuit 315 are selected to be provided as an output from multiplexer 330. The output from coarse analog to digital converter 305 is also provided to a coarse output stage 350.

Fine output stage 340 includes two output pipes—one to handle a Sample A output and the other to handle a Sample B output. The output pipe for Sample A includes a flip-flop 342 that clocks the output from fine analog to digital converter 310 on one clock phase (i.e., clka), and provides the clocked output to an encoder 344. Encoder 344 encodes the output of fine analog to digital converter 310 and provides it as a least significant portion of an overall conversion value (i.e., Data A Fine). Similarly, the output pipe for Sample A includes a flip-flop 343 that clocks the output from fine analog to digital converter 310 on another clock phase (i.e., clkb), and provides the clocked output to an encoder 345. Encoder 345 encodes the output of fine analog to digital converter 310 and provides it as a least significant portion of an overall conversion value (i.e., Data B Fine)

Coarse output stage 350 also includes two output pipes—one to handle a Sample A output and the other to handle a Sample B output. The output pipe for Sample A includes a flip-flop 352 that clocks the output from coarse analog to digital converter 305 on one clock phase (i.e., clka), and a subsequent flip-flop 354 that clocks the output from flip-flop 352 on the opposite clock phase (i.e., clkb). The output from flip-flop 354 is provided to an encoder 356 that encodes the output of coarse analog to digital converter 305 and provides it as a most significant portion of an overall conversion value (i.e., Data A Coarse). Similarly, the output pipe for Sample B includes a flip-flop 353 that clocks the output from coarse analog to digital converter 305 on one clock phase (i.e., clkb), and a subsequent flip-flop 355 that clocks the output from flip-flop 353 on the opposite clock phase (i.e., clka). The output from flip-flop 355 is provided to an encoder 357 that encodes the output of coarse analog to digital converter 305 and provides it as a most significant portion of an overall conversion value (i.e., Data B Coarse).

In operation, select input 329 is set to select Sample A via differential multiplexers 326, 328. Coarse analog to digital converter 305 converts Sample A to nine bit coarse output 306 prior to assertion of clkb and subsequent to assertion of clka. Coarse output 306 is clocked into flip-flop 352 upon assertion of clkb, and subsequently into flip-flop 354 upon assertion of clka. The output of flip-flop 354 is then encoded and provided as Data A Coarse. Coarse output 306 is used to select the bank of comparators of fine analog to digital converter 310 that are to be utilized as the fine output. In particular, clock gating circuit 315 asserts a clock to the chosen bank of comparators and chooses the output from the chosen bank of comparators via multiplexer 330. Thus, for example, where coarse output 306 indicates that Sample A is a midrange sample, a comparator bank corresponding to the midrange is selected and clocked. As an alternative example, where coarse output 306 indicates that Sample A is an upper range sample, a comparator bank corresponding to the upper range is selected and clocked. The selected output from multiplexer 330 is clocked into flip-flop 342 upon assertion of clka, and the output of flip-flop 342 is encoded and provided as Data A Fine. Data A Coarse and Data A Fine may then be combined as the output of analog to digital converter 300.

Conversion of Sample B is interleaved with the conversion of Sample A. In particular, when select input 329 is selecting Sample A, then select input 331 is selecting Sample B. This allows for settling the output of the coarse analog to digital converter before it is used as an input to the fine analog to digital converter. Coarse analog to digital converter 305 converts Sample B to nine bit coarse output 306 subsequent to assertion of clkb and prior to assertion of clka. Coarse output 306 is clocked into flip-flop 353 upon assertion of clka, and subsequently into flip-flop 355 upon assertion of clkb. The output of flip-flop 355 is then encoded and provided as Data B Coarse. Coarse output 306 is used to select the bank of comparators of fine analog to digital converter 310 that are to be utilized as the fine output. In particular, clock gating circuit 315 asserts a clock to the chosen bank of comparators and chooses the output from the chosen bank of comparators via multiplexer 330. The selected output from multiplexer 330 is clocked into flip-flop 343 upon assertion of clkb, and the output of flip-flop 343 is encoded and provided as Data B Fine. Data B Coarse and Data B Fine may then be combined as the output of analog to digital converter 300.

As one of many advantages, the number of comparators dissipating power in any conversion process may be reduced substantially when compared with other analog to digital converter architectures. Further, since a comparator exists in clocked fine analog to digital converter 310 for a large number of analog to digital converter levels, switching of the reference voltage inputs is reduced or eliminated. This allows the analog to digital converter to operate at relatively high speeds without incurring the power and space penalties exhibited by other analog to digital converter architectures. The aforementioned advantages are merely exemplary, and based on the disclosure provided herein, one of ordinary skill in the art may recognize other advantages that may be achieved through use of analog to digital converters in accordance with different embodiments of the present invention.

Figure 4:
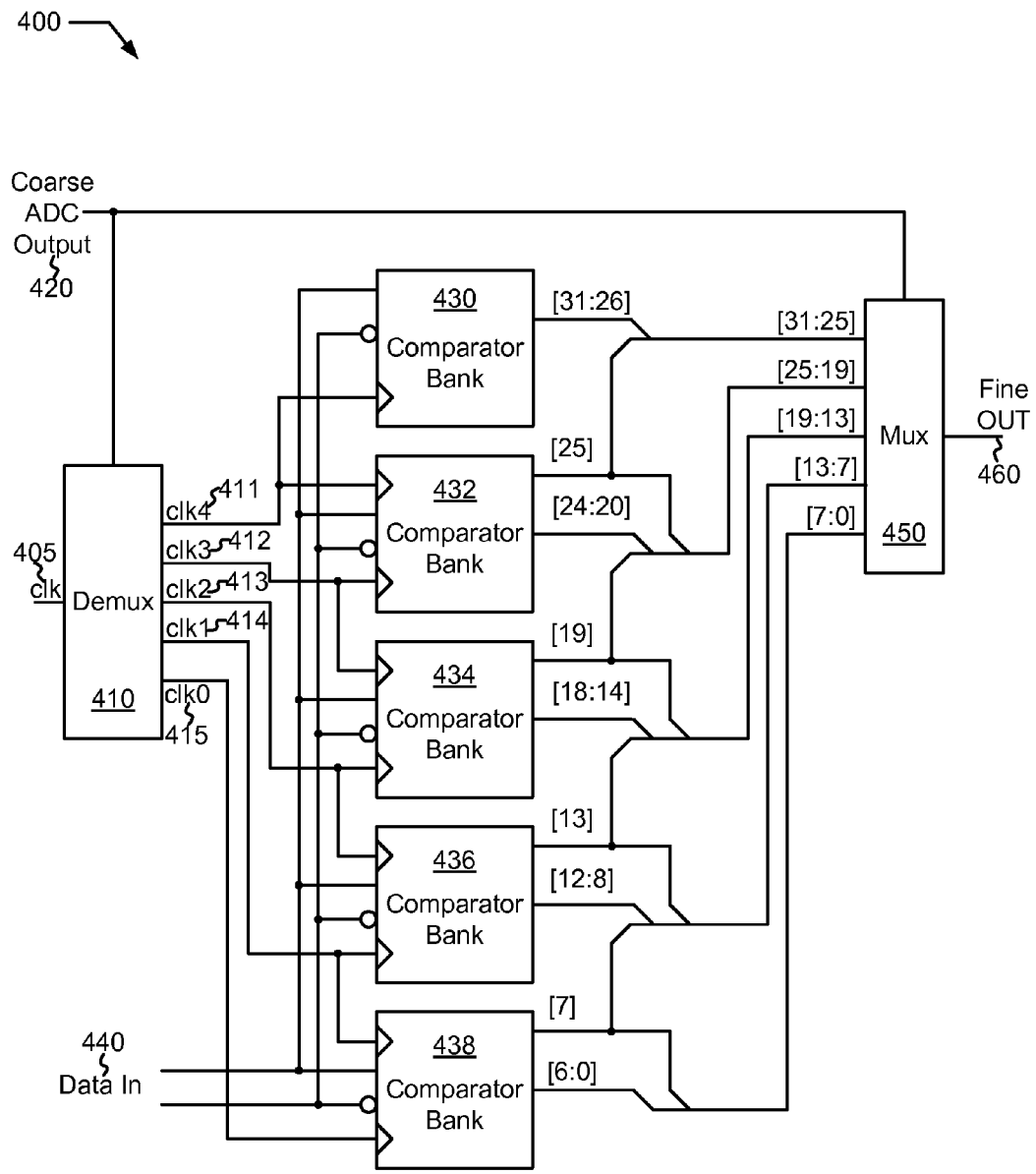
FIG. 4 shows an exemplary embodiment of a clocked comparator stage that may be used in relation to the analog to digital converter of FIG. 3 in accordance with various embodiments of the present invention.

Turning to FIG. 4, an exemplary embodiment of a clocked comparator stage 400 is shown that may be used in place of the combination of clocked fine analog to digital converter 310, multiplexer 330 and clock gating circuit 315 in accordance with various embodiments of the present invention. Clocked comparator stage 400 includes a de-multiplexer 410 that receives a clock input 450 and distributes the clock input to a selected clock output (i.e., one of clock outputs 411, 412, 413, 414, 415). The selected clock output is chosen based on a coarse analog to digital converter 420 (i.e., the output of coarse analog to digital converter 305). Clocked comparator stage 400 includes a number of comparator banks 430, 432, 434, 436, 438 that each receive a data input 440 (i.e., the data output from multiplexer 328) for comparison. Each of the comparator banks compares data input 440 with a different reference range, and provides an output based on the comparison with the particular reference range. As one example, comparator bank 430 compares the data input 440 with an upper reference range; comparator bank 438 compares data input 440 with a lower input reference range; and each of comparator banks 432, 434, 436 compare data input 440 against respective middle reference ranges.

In operation, one or more of comparator banks 430, 432, 434, 436, 438 compare data input 440 with a reference range that is around the magnitude of data input 440. The other comparator banks do not provide useful comparison information as they are away from the input voltage being converted. A comparator bank that will provide useful comparison information is predicted by coarse analog to digital converter output 420, and only the selected range of comparators associated with the selected comparator banks are clocked as governed by de-multiplexer 410. The other comparator banks are not clocked resulting in a considerable power savings. In this particular embodiment, thirty-two comparators are implemented across compararator banks 430, 432, 434, 436, 438, with the thirty-two comparators being distributed across an overall input range. When clock output 411 is selected by de-multiplexer 410 based on coarse analog to digital converter output 420, comparators [31:25] are clocked. Similarly, when clock output 412 is selected by de-multiplexer 410 based on coarse analog to digital converter output 420, comparators [25:19] are clocked. When clock output 413 is selected by de-multiplexer 410 based on coarse analog to digital converter output 420, comparators [19:13] are clocked. When clock output 414 is selected by de-multiplexer 410 based on coarse analog to digital converter output 420, comparators [13:7] are clocked. When clock output 415 is selected by de-multiplexer 410 based on coarse analog to digital converter output 420, comparators [7:0] are clocked.

Only the clocked comparators are provided as an output from clocked comparator stage 400 via a multiplexer 450. The selection is based on coarse analog to digital converter output 420. A Fine output 460 (corresponding to the output from multiplexer 330) is provided from clocked comparator stage 400.

Figure 5:
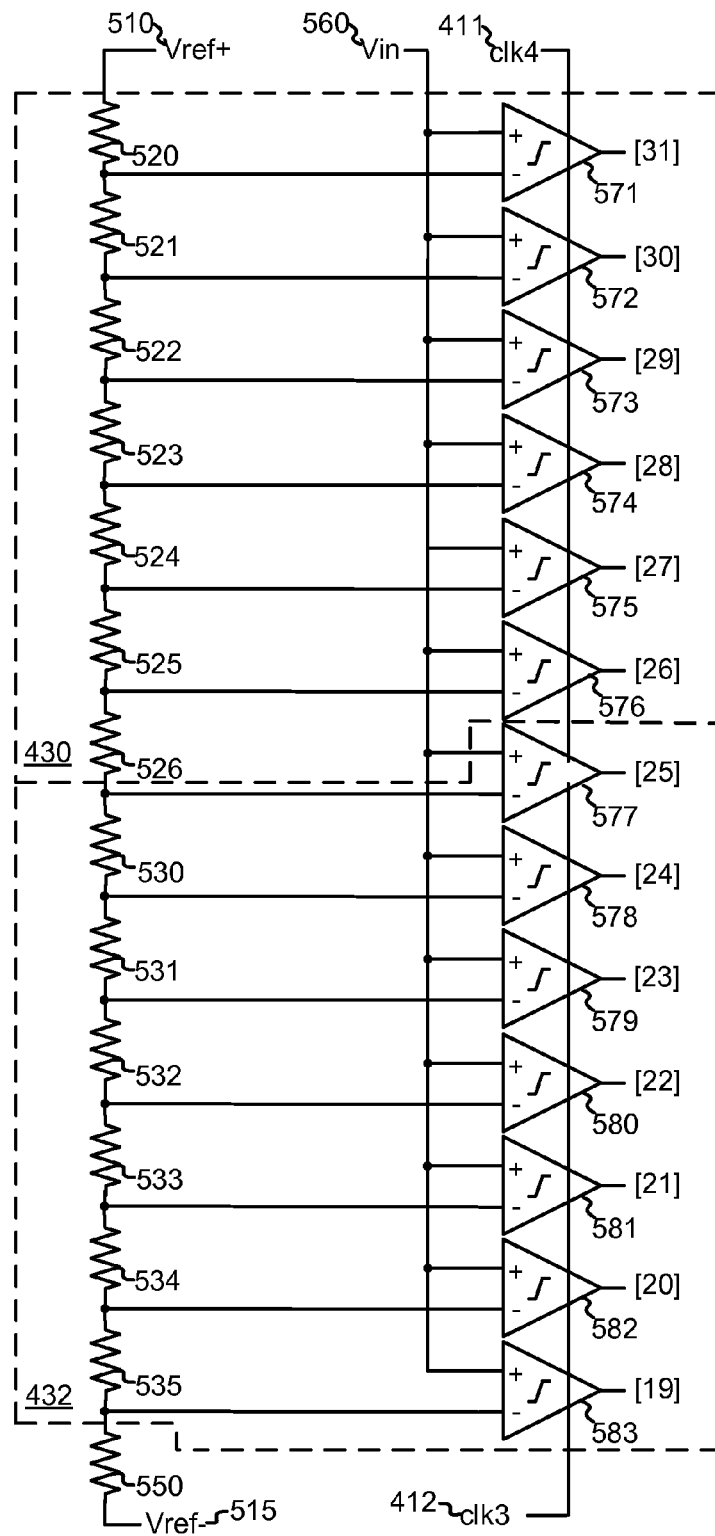
FIG. 5 shows an exemplary implementation of clocked comparators that may be used in relation to the clocked comparator stage of FIG. 4 in accordance with some embodiments of the present invention.

FIG. 5 shows an exemplary implementation of comparator banks 430, 432 of FIG. 4 that may be used in accordance with some embodiments of the present invention. It should be noted that voltage input 560 (corresponding to data input 440) is a single ended input and the various comparators are shown as single ended comparators for simplicity, but that a differential input and differential comparators may be used in relation various embodiments of the present invention. Each of the comparators compare voltage input 560 against a voltage reference derived from a resistor ladder comprising a number of resistors 520, 521, 522, 523, 524, 525, 526, 530, 531, 532, 533, 534, 535, 550 extending between an upper voltage reference 510 and a lower voltage reference 515.

In particular, comparator bank 430 includes: a dynamic comparator 571 providing output and comparing voltage input 560 with a reference voltage taken between resistor 520 and resistor 521; a dynamic comparator 572 providing output and comparing voltage input 560 with a reference voltage taken between resistor 521 and resistor 522; a dynamic comparator 573 providing output and comparing voltage input 560 with a reference voltage taken between resistor 522 and resistor 523; a dynamic comparator 574 providing output and comparing voltage input 560 with a reference voltage taken between resistor 523 and resistor 524; a dynamic comparator 575 providing output and comparing voltage input 560 with a reference voltage taken between resistor 524 and resistor 525; and a dynamic comparator 576 providing output and comparing voltage input 560 with a reference voltage taken between resistor 525 and resistor 526. Comparator bank 432 includes: a dynamic comparator 577 providing output and comparing voltage input 560 with a reference voltage taken between resistor 526 and resistor 530; a dynamic comparator 578 providing output and comparing voltage input 560 with a reference voltage taken between resistor 530 and resistor 531; a dynamic comparator 579 providing output and comparing voltage input 560 with a reference voltage taken between resistor 531 and resistor 532; a dynamic comparator 580 providing output and comparing voltage input 560 with a reference voltage taken between resistor 532 and resistor 533; a dynamic comparator 581 providing output and comparing voltage input 560 with a reference voltage taken between resistor 533 and resistor 534; a dynamic comparator 582 providing output and comparing voltage input 560 with a reference voltage taken between resistor 534 and resistor 535; and a dynamic comparator 583 providing output and comparing voltage input 560 with a reference voltage taken between resistor 535 and resistor 550. Comparators 571, 572, 573, 574, 575, 576 are clocked by clock output 411, and comparators 578, 579, 580, 581, 582, 583 are clocked by clock output 412. Crossover comparator 577 is clocked by both output clock 411 and output clock 412. Comparators 571, 572, 573, 574, 575, 576, 577, 578, 579, 580, 581, 582, 583 may be any clocked comparator known in the art. In some particular embodiments of the present invention, comparators 571, 572, 573, 574, 575, 576, 577, 578, 579, 580, 581, 582, 583 are dynamic comparators as are known in the art. Again, the aforementioned comparators may be single ended or differential depending upon whether input voltages 560, 440 are single ended or differential. In some embodiments of the present invention, the resistor ladder may be replaced by a digital to analog converter as described in U.S. patent application Ser. No. 11/435,810 entitled "AREA AND POWER EFFICIENT ANALOG TO DIGITAL CONVERTER AND METHODS FOR USING SUCH" and filed by Bailey on a date even herewith. The entirety of the aforementioned reference is incorporated herein by reference for all purposes.

Figure 6:
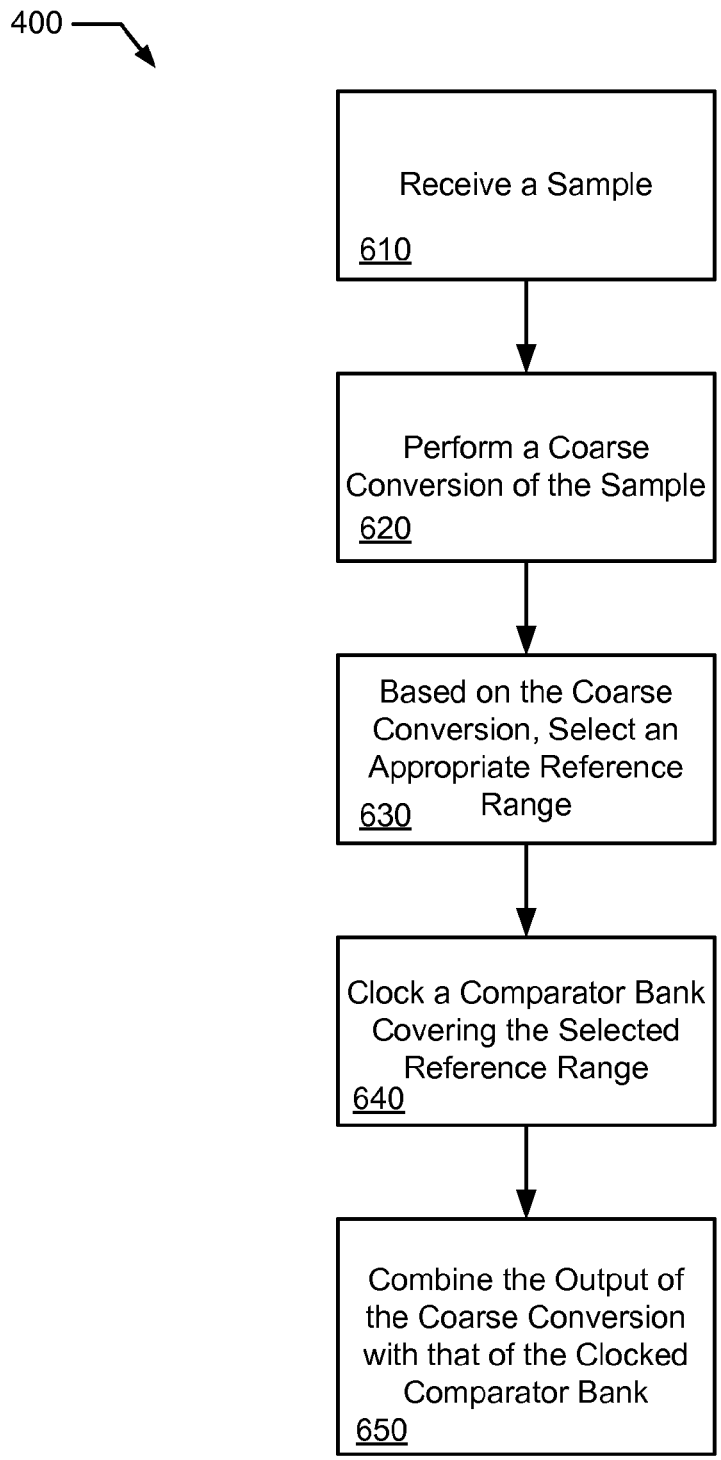
FIG. 6 is a flow diagram showing a method in accordance with various embodiments of the present invention for performing analog to digital conversion.

Turning to FIG. 6, a flow diagram 600 depicts a method in accordance with various embodiments of the present invention for performing analog to digital conversion. Following flow diagram 600, an input voltage sample is received for conversion (block 610). This input voltage is provided to a coarse analog to digital converter where a coarse conversion is performed (block 620). The coarse conversion may be performed by applying the input voltage to a series of clocked comparators which compare the input voltage against a number of coarse reference voltage levels. This results in a coarse digital representation of the input voltage. The coarse digital representation of the input voltage is used to select a reference voltage range for which a fine conversion will yield additional information (block 630). This may include, for example, selecting a reference voltage range that surrounds the voltage indicated by the coarse conversion. The selected range is covered by a comparator bank that includes a number of clocked comparators that each compare the input voltage with respective fine levels across the selected range. The comparison is completed upon assertion of a clock to the comparator bank(s) including the comparators covering the selected reference range (block 640). By doing this, only a limited number of comparators are used in any given conversion. By limiting the number of comparators used in a conversion, power dissipation in the analog to digital conversion process is reduced. The output of the clocked comparator bank(s) is then combined with the output from the coarse conversion process to yield a complete digital representation of the input voltage (block 650).

In conclusion, the invention provides novel systems, circuits, methods and arrangements for converting an analog signal to a digital signal. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for converting an analog signal to a digital signal, the method comprising:
    providing an analog to digital converter including a fine conversion stage and a coarse conversion stage, wherein the fine conversion stage includes a first comparator bank clocked by a first clock and a second comparator bank clocked by a second clock, and wherein the coarse conversion stage provides a coarse output and the fine conversion stage provides a fine output;
    applying an input voltage and a coarse reference voltage to the coarse conversion stage;
    applying the input voltage and a first fine reference voltage range to the first comparator bank;
    applying the input voltage and a second fine reference voltage range to the second comparator bank;
    based on an output of the coarse conversion stage, selectably asserting the first clock or the second clock;
    based on the output of the coarse conversion stage, selecting an output of the first comparator bank or an output of the second comparator bank as the fine output; and
    combining the coarse output and the fine output.

2. The method of claim 1, wherein the first comparator bank includes a first group of comparators each clocked by the first clock, wherein the second comparator bank includes a second group of comparators each clocked by the second clock, wherein the output of the first comparator bank includes outputs of comparators of the first group of comparators, and wherein the output of the second comparator bank includes outputs of comparators of the second group of comparators.

3. The method of claim 2, wherein the comparators of the first group of comparators and the comparators of the second group of comparators are dynamic comparators.

4. The method of claim 1, wherein the fine conversion stage is a three bit analog to digital converter, and wherein the coarse conversion stage is a 3.3 bit analog to digital converter.

5. The method of claim 4, wherein the coarse conversion stage includes nine clocked comparators, and wherein each of the first comparator bank and the second comparator bank includes at least seven clocked comparators.

6. An analog to digital converter circuit, the circuit comprising:
    a first conversion stage, wherein the first conversion stage includes at least a first comparator and a second comparator, wherein the first comparator is operable to compare an input voltage and a first reference voltage upon assertion of a first clock, and wherein the second comparator is operable to compare the input voltage and a second reference voltage upon assertion of a second clock;
    a second conversion stage, wherein the second conversion stage includes at least a third comparator, wherein the third comparator receives the input voltage and a third reference voltage; and
    a clock circuit, wherein the clock circuit selectably asserts one of the first clock and the second clock based at least in part on an output of the second conversion stage.

7. The analog to digital converter circuit of claim 6, wherein the first comparator and the second comparator are dynamic comparators.

8. The analog to digital converter circuit of claim 6, wherein the first comparator is associated with a first group of comparators and the second comparator is associated with a second group of comparators, wherein each comparator in the first group of comparators is clocked by the first clock, and wherein each comparator in the second group of comparators is clocked by the second clock.

9. The analog to digital converter of claim 8, wherein the first group of comparators and the second group of comparators each includes each includes at least seven dynamic comparators.

10. The analog to digital converter circuit of claim 8, wherein an output of the first conversion stage is selected based on the output of the second conversion stage to include an output of each comparator in the first group of comparators or an output of each comparator in the second group of comparators.

11. The analog to digital converter circuit of claim 10, wherein the circuit further includes a converted output, and wherein the converted output is a combination of the output of the first conversion stage and the output of the second conversion stage.

12. The analog to digital converter circuit of claim 11, wherein the output of the first conversion stage is a fine output, and wherein the output of the second conversion stage is a coarse output.

13. The analog to digital converter of claim 11, wherein the third comparator is associated with a third group of comparators, and wherein the output of the second conversion stage includes an output of each comparator in the third group of comparators.

14. The analog to digital converter of claim 12, wherein the third group of comparators includes nine clocked comparators.

15. The analog to digital converter circuit of claim 6, wherein the first comparator and the second comparator are part of a fine analog to digital converter, and wherein the third comparator is part of a coarse analog to digital converter.

16. The analog to digital converter circuit of claim 15, wherein the coarse analog to digital converter is a 3.3 bit analog to digital converter, and wherein the fine analog to digital converter is a three bit analog to digital converter.

17. An analog to digital converter circuit, the circuit comprising:
- a first conversion stage, wherein the first conversion stage includes at least a first set of comparators operable to compare an input voltage to a first reference voltage upon assertion of a first clock, and a second set of comparators operable to compare the input voltage to a second reference voltage upon assertion of a second clock, and wherein the first conversion stage provides a first output;
- a second conversion stage, wherein the second conversion stage includes at least a third comparator, wherein the third comparator is operable to compare the input voltage to a third reference voltage, and to provide a second output;
- a clock circuit, wherein the clock circuit selectably asserts one of the first clock and the second clock based at least in part on the second output.

18. The circuit of claim 17, wherein the circuit further comprises:
- a coarse output pipe, wherein the coarse output pipe includes a first pipe in parallel with a second pipe, wherein the second output is provided to the first output pipe where it is synchronized to a first phase of an output clock and subsequently to a second phase of the output clock to yield a first coarse output, and wherein the second output is provided to the second output pipe where it is synchronized to the second phase of the output clock and subsequently to the first phase of the output clock to yield a second coarse output.

19. The circuit of claim 18, wherein the circuit further comprises:
- a fine output pipe, wherein the fine output pipe includes a third pipe in parallel with a fourth pipe, wherein the first output is provided to the third output pipe where it is synchronized to the second phase of the output clock to yield a first fine output, and wherein the first output is provided to the fourth output pipe where it is synchronized to the first phase of the output clock to yield a second fine output.

20. The circuit of claim 19, wherein the first coarse output is combined with the first fine output to yield a first complete output representing a first sample of the input, and wherein the second coarse output is combined with the second fine output to yield a second complete output representing a second sample of the input.

21. The circuit of claim 20, wherein the second conversion stage converts the first sample prior to assertion of the first phase of the output clock and subsequent to assertion of the second phase of the output clock.

22. The circuit of claim 20, the circuit further comprising:
- an input stage, wherein the input stage includes a first multiplexer feeding the first conversion stage and a second multiplexer feeding the second conversion stage, wherein the first multiplexer and the second multiplexer are operable to selectively feed the first sample and the second samples to the first conversion stage and the second conversion stage.

23. The method of claim 1, wherein the method further comprises:
- synchronizing the coarse output to a first phase of an output clock and subsequently to a second phase of the output clock to yield a first piped coarse output;
- synchronizing the coarse output to the second phase of the output clock and subsequently to the first phase of the output clock to yield a second piped coarse output;
- synchronizing the fine output to the second phase of the output clock to yield a first fine output; and
- synchronizing the fine output to the first phase of the output clock to yield a second fine output.

24. The method of claim 23, wherein the method further comprises:
- combining the first coarse output with the first fine output to yield a first complete output representing a first sample of the input; and
- combining the second coarse output with the second fine output to yield a second complete output representing a second sample of the input.

25. The method of claim 24, wherein the method further comprises:
- providing the first sample of the input to the first conversion stage during a first time window, and providing the second sample of the input to the second conversion stage during a second time window.

\* \* \* \* \*